(12) United States Patent
Ahmad et al.

(10) Patent No.: US 11,603,472 B2
(45) Date of Patent: *Mar. 14, 2023

(54) METHOD OF COATING A PRINTED CIRCUIT BOARD WITH A VISCOELASTIC OR NON-NEWTONIAN COATING

(71) Applicant: actnano, Inc., Boston, MA (US)

(72) Inventors: Syed Taymur Ahmad, Chicago, IL (US); Justin Kleingartner, Boston, MA (US); Sruti Balasubramanian, Quincy, MA (US)

(*) Notice: Subject to any disclaimer, the term of this patent is extended or adjusted under 35 U.S.C. 154(b) by 37 days.

This patent is subject to a terminal disclaimer.

(21) Appl. No.: 17/403,212

(22) Filed: Aug. 16, 2021

(65) Prior Publication Data

US 2021/0380815 A1    Dec. 9, 2021

Related U.S. Application Data

(62) Division of application No. 16/171,990, filed on Oct. 26, 2018, now Pat. No. 11,149,150.

(60) Provisional application No. 62/577,471, filed on Oct. 26, 2017.

(51) Int. Cl.
| | |
|---|---|
| C09D 5/00 | (2006.01) |
| H05K 3/28 | (2006.01) |
| C09D 7/20 | (2018.01) |
| C09D 1/00 | (2006.01) |
| C09D 183/04 | (2006.01) |
| C08K 3/04 | (2006.01) |
| C08G 77/00 | (2006.01) |
| C08K 3/22 | (2006.01) |
| C08K 3/36 | (2006.01) |
| H01B 3/46 | (2006.01) |
| C08L 83/04 | (2006.01) |
| C09D 7/00 | (2018.01) |
| C08L 27/12 | (2006.01) |
| C08L 23/00 | (2006.01) |

(52) U.S. Cl.
CPC ............... *C09D 5/00* (2013.01); *C08G 77/80* (2013.01); *C08K 3/04* (2013.01); *C08K 3/22* (2013.01); *C08K 3/36* (2013.01); *C08L 23/00* (2013.01); *C08L 27/12* (2013.01); *C08L 83/04* (2013.01); *C09D 1/00* (2013.01); *C09D 7/00* (2013.01); *C09D 7/20* (2018.01); *C09D 183/04* (2013.01); *H01B 3/46* (2013.01); *H05K 3/28* (2013.01); *H05K 3/282* (2013.01); *H05K 2201/0162* (2013.01); *H05K 2201/0209* (2013.01); *H05K 2201/0212* (2013.01); *H05K 2203/0759* (2013.01)

(58) Field of Classification Search
CPC .................................. C09D 5/00; H05K 3/28
See application file for complete search history.

(56) References Cited

U.S. PATENT DOCUMENTS

| | | | | |
|---|---|---|---|---|
| 3,652,333 | A | * | 3/1972 | Warren ............... C09D 175/06 |
| | | | | 428/424.4 |
| 4,803,100 | A | | 2/1989 | Ameen et al. |
| 4,818,784 | A | * | 4/1989 | Iwase ................... C09D 133/16 |
| | | | | 524/463 |
| 7,791,814 | B2 | | 9/2010 | Liogier D'ardhuy |
| 7,820,748 | B2 | | 10/2010 | Inabe |
| 8,017,183 | B2 | | 9/2011 | Yang |
| 10,745,603 | B2 | | 8/2020 | Yamada |
| 11,149,150 | B2 | * | 10/2021 | Ahmad .................. C08L 83/04 |
| 2010/0068467 | A1 | | 3/2010 | Song |
| 2016/0355691 | A1 | | 12/2016 | Kim |

FOREIGN PATENT DOCUMENTS

| | | |
|---|---|---|
| JP | 1-115985 | 5/1989 |
| JP | 6-505166 | 6/1994 |
| JP | 2009-70722 | 4/2009 |
| JP | 2017-61613 | 3/2017 |
| KR | 2008 0034686 A | 4/2008 |
| WO | WO1992/014428 | 9/1982 |
| WO | WO 2013/118752 A1 | 8/2013 |

OTHER PUBLICATIONS

International Search Report and Written Opinion dated Oct. 26, 2018 in corresponding PCT Application No. PCT/US2018/057741.
Kakiuchida et al., "Viscoelastic and Structural Properties of a Phenyl-Modified Polysiloxane System with a Three-Dimensional Structure", Journal of Physical Chemistry Part B: Condensed Matter, Materials, Surfaces, Interfaces & Biophysical, vol. 110, No. 14, Mar. 17, 2006, 7321-7327.

* cited by examiner

*Primary Examiner* — Vickey Nerangis
(74) *Attorney, Agent, or Firm* — Finnegan, Henderson, Farabow, Garrett & Dunner, LLP

(57) ABSTRACT

A composition for forming a protective coating on an electronic device that is in the form of a non-Newtonian fluid that exhibits both viscous and elastic properties, and that forms at least one coating that is hydrophobic, oleophobic, or oleophilic is disclosed. The viscous and elastic properties associated with the non-Newtonian fluid allows the composition to redistribute after being applied as a coating an electronic device. Methods for protecting an electronic device from liquid contaminants by applying the disclosed composition and electronic devices comprising the composition are also disclosed. An electronic device, such as a printed circuit board, having a film made of the composition is also disclosed.

19 Claims, No Drawings

METHOD OF COATING A PRINTED CIRCUIT BOARD WITH A VISCOELASTIC OR NON-NEWTONIAN COATING

CROSS-REFERENCE TO RELATED PATENT APPLICATIONS

This application is a Divisional Application of U.S. patent application Ser. No. 16/171,990, filed Oct. 26, 2018, which claims the benefit of U.S. Provisional Application No. 62/577,471, filed Oct. 26, 2017, both of which are incorporated herein by reference in their entireties.

TECHNICAL FIELD

The present disclosure generally relates to compositions comprising non-Newtonian fluids that form hydrophobic, oleophobic, and/or oleophilic coatings, as well as to electronic devices containing such coatings. The present disclosure also relates to methods of protecting an electronic device from liquid contaminants by applying the disclosed compositions to desired parts of the device, such as the printed circuit board.

BACKGROUND

Electronic devices are comprised of electrically conductive and insulating components, which can be adversely affected by a variety of contaminants. Exposure to liquids like water, will often lead to corrosion of these components, or a short circuit that will eventually destroy the function of the electronic device. In addition, as such devices become more sophisticated with increased functionality, they are being used in more hazardous environments that require greater protection from contaminants, especially liquids.

As a result, water resistant coatings are becoming a more popular form of protection of such devices. Traditional water-resistant coatings consist of a conformal coating or vacuum coating. Before application of these coatings to an electronic device, certain components of the electronic device require masking to ensure there is no inhibition of the flow of electric current. This process is expensive and time consuming. In addition, the thickness of traditional coatings can adversely affect the functionality of the electronic device and act as a thermal insulator. Further, traditional conformal coatings could also be worn away due to abrasion.

Existing uses of compositions that exhibit non-Newtonian behavior used in coating can be seen in, for example, U.S. Pat. No. 4,728,578 and U.S. patent application Ser. No. 11/269,593. An example of a wet, transparent conductive film for application to an electronic device can be seen in U.S. patent application Ser. No. 13/611,575. An example of liquid spray coating can be seen in U.S. Pat. No. 5,108,799. None of these examples provide an effective composition or method for protecting an electronic device.

Accordingly, there is need for coated electronic devices and methods that allow for protection of electronic devices from contaminates, such as particulates including dust and dirt, as well as liquids, such as water and bodily fluids, including sweat. Furthermore, there is a need for a coating that can be applied without the need to mask components prior to coating. There is also a need for a coating that can cover an entire printed circuit board, without inhibiting the functionality of the device and without the coating being easily worn away.

SUMMARY

In view of the foregoing, there is disclosed a composition that exhibits both viscous and elastic properties that allow the compound to redistribute after being applied as a coating in or on at least a portion of an electronic device.

In one embodiment, there is described a composition for forming a non-Newtonian coating on an electronic device, the composition comprising: at least one hydrophobic fluid, wherein the hydrophobic fluid forms a viscoelastic coating that has electrical insulating properties, and is hydrophobic, oleophobic, oleophilic, or a combination thereof.

There is also disclosed a method of treating an electronic device by applying a viscoelastic coating to the electronic device, the method comprising applying a composition to an electronic device, the composition comprising: at least one hydrophobic fluid, wherein the hydrophobic fluid forms a viscoelastic coating that has electrical insulating properties and is hydrophobic, oleophobic, oleophilic, or a combination thereof.

In another embodiment, there is disclosed a coating to protect a substrate. For example, the coating may comprise at least one hydrophobic material comprising a polysiloxane compound and having electrical insulating properties, wherein the coating is hydrophobic, oleophobic, or oleophilic, and exhibits viscoelastic properties that allow it to redistribute after being applied to the electronic component.

In yet another embodiment, there is disclosed a coating to protect a substrate, wherein the coating comprises at least one hydrophobic material that has electrical insulating properties, and comprises a polysiloxane compound, wherein the coating is hydrophobic, oleophobic, or oleophilic, and exhibits viscoelastic properties that allow it to redistribute after being applied to the electronic component.

In still another embodiment, there is disclosed an electronic device having a viscoelastic film attached thereto, the film comprising the composition described herein. For example, the electronic device is a printed circuit board, the entirety of which can be treated without first masking any of the components.

DETAILED DESCRIPTION

As used herein, "ambient conditions" refers to 72° F. and 45% humidity.

As used herein, a "non-Newtonian fluid," or versions thereof, means a fluid whose viscosity is variable based on applied stress or force. The resulting coating exhibits non-Newtonian behavior that is described by the coating's non-linear relationship between shear stress and shear rate or the presence of a yield stress.

A non-Newtonian fluid comprises a single or multi-phase fluid that exhibits non-Newtonian behavior. It may also include single or multiple constituents.

The non-Newtonian fluid is sometimes referred to as a complex fluid. In one embodiment, the non-Newtonian fluid is a viscoelastic fluid.

As used herein, "viscoelastic fluid" means a fluid that exhibits both viscous and elastic characteristics when undergoing deformation. To protect an electronic device from contaminants, such as water or bodily fluids, dust or other particulates, and the like, there is disclosed a composition comprising a non-Newtonian fluid. There is further disclosed a method of treating an electronic device with a non-Newtonian fluid as described herein, as well as an electronic device comprising the non-Newtonian fluid.

In one embodiment, a non-Newtonian fluid comprises a viscoelastic fluid that exhibits both viscous and elastic characteristics. A viscoelastic fluid, unlike a purely elastic material, will flow like a viscous liquid under load but will maintain the elastic characteristics of a solid when not under load. Viscoelasticity has been well-studied and the behavior of viscoelastic fluids is known in the arts. The elastic properties associated with the disclosed compounds allow the material to resist liquid contamination and material deformation due to body forces (e.g., gravity), and the viscous properties allow the material to redistribute itself under stress and over time, such as to be displaced when a force is applied or to evenly cover a surface.

The properties of a non-Newtonian fluid therefore make it favorable for use as a coating on electronic devices. Desirable non-Newtonian fluids are comprised of materials that adhere or adsorb to the surface of the electronic device so as to maintain a thin film, typically in the range of nanometers to angstroms. Such a film may be achieved through Van Der Waals forces, allowing a thin coating to exist even after much of the fluid has been displaced. Thicker thin films can be attained when the fluid exhibits a yield stress.

The use of a non-Newtonian fluid as a coating may achieve benefits that do not exist with the use of traditional conformal or vacuum coatings. The viscous properties of a non-Newtonian fluid may eliminate the need to mask certain components prior to coating an electronic device. Typically, masking certain components is used to allow for the flow of an electric current through the openings in the coating. A non-Newtonian fluid coating instead exhibits viscous properties by being displaced when a component is introduced to the electronic device. Displacement allows the component to connect to the electronic device with no interference. The displaced non-Newtonian fluid coating will exhibit viscous properties and redistribute itself to protect the electronic device. Masking a component is not necessary as the electric current will pass to the component, however, masking may still be done if desired.

In some embodiments, the coating may have electrical insulating properties. As used herein, a coating having electrical insulating properties is defined as a coating that has no or very little electric current flowing through it under the influence of an electric field. In general, an electrical insulator is a material that has little to no electrical conductivity, thus allowing little to no electrical current to flow through it.

In various embodiments, a portion of the internal components, or the entirety of the internal components of electronic device may be coated with a non-Newtonian fluid before additional components are introduced into the device, without the need to mask any parts of the electronic device. Components can be introduced after the coating has been applied and coating will not inhibit the flow of electric current between the component and the electronic device. Manufacturing costs and difficulty are generally increased due to masking. Using a non-Newtonian fluid coating as disclosed herein can result in a decrease in both manufacturing costs and difficulty, due to the need for masking having been greatly reduced or eliminated altogether.

The viscous properties of a non-Newtonian fluid allow for the non-Newtonian fluid to flow in certain situations. The viscous properties allow for ease of repair when the non-Newtonian fluid is applied as a coating to an electronic device. With traditional conformal and vacuum coatings, abrasion caused by components or other sources will reduce the overall resistance to liquid contamination unless the abraded coating is replaced. To replace the coating using traditional methods is expensive and time consuming.

As used herein, "redistribute" is used to describe the ability of the coating to intrinsically self-heal to allow the coating to repair damage to the coating, such as when a hole is created when a connection is made between a male and female component. The ability of the coating to redistribute is the result of a temporary increase in mobility leading to a re-flow of the material in the damaged area. Redistribution or intrinsic self-healing of the coating does not require the addition of external factors, such as a healing agent, or the application of outside factors, such as heat or pressure. In one embodiment, the coating is able to react to a force but stays in place such as when a connection is made that would preclude the coating to flow back once the force is removed.

As described, the disclosed non-Newtonian fluid coating will redistribute itself, or "self-heal," to replace areas of the coating that have been worn away due to abrasion or damaged in other ways. The non-Newtonian fluid will redistribute itself over time to fix inconsistencies in the surface of the non-Newtonian fluid coating. The redistribution, or "self-healing," capability can reduce costs associated with applying and maintaining the coating.

In some embodiments, the coating may spread on a substrate as described by the spreading coefficient (S), which is shown in the following equation:

$$S=\gamma_{SA}-(\gamma_{SC}+\gamma_{LA})$$

In the above-mentioned equation, $\gamma_{SA}$ represents the surface tension between the substrate and the air, $\gamma_{SC}$ represents the surface tension between the substrate and the coating, and $\gamma_{LA}$ represents the interfacial tension. Spreading may occur when the spreading coefficient is positive, or $\gamma_{SA}$ is greater than $(\gamma_{SC}+\gamma_{LA})$. When the spreading coefficient is positive, this means that wetting of the coating on the substrate can be completed. On the other hand, when the spreading coefficient is not positive, the wetting cannot be completed. Instead, the spreading liquid may form globules or floating lens.

In one embodiment, when applied as a coating the non-Newtonian fluid coating may range in thickness from 25 nm to 200 µm, such as 50 nm to 50 µm, such as 25 to 250 nanometers, such as 50 to 150 nanometers, or even from 80 to 120 nanometers. Coating thickness may be measured by non-destructive optical techniques, such as ellipsometry, spectral reflectance techniques like interferometry and confocal microscopy. Non-limiting examples of destructive methods to measure coating thickness includes SEM. Traditional coatings, such as conformal and vacuum coatings are typically much thicker. For example, traditional coatings typically range in thickness from up to hundreds of microns, which may impede both the radio frequency and Wi-Fi transmission of the electronic device, and further acts as a thermal insulator. The thinner range of a non-Newtonian fluid coating does not adversely affect the functionality of an electronic device, nor does it act as a thermal insulator. A non-limiting example of a functioning electronic device is a fully assembled printed circuit board. A fully assembled printed circuit board with a non-Newtonian fluid coating will exhibit normal radio frequency performance, normal thermal properties, and other normal functionalities.

Non-limiting examples of what a non-Newtonian fluid may include functionalized poly siloxanes, linear and cyclic silicones, metal oxides (such as, for example, silica and titania), fumed functionalized silica, styrene-ethylene/butylene-styrene or styrene-ethylene/propylene-styrene materials swelled with mineral oils or diesters, long chain fatty alcohols, functionalized fluoropolymers, functionalized or non-functionalized poly oligomeric silsesquioxanes, hydrophilic gellants like carbomers, polysaccharide gums, polyolefins (such as, for example, linear or branched polyethylene, linear or branched polypropylene, and the like).

In an embodiment, the disclosed composition may further comprise particles, such as fluoropolymer particles, clay particles (such as, but not limited to, kaolinite, laponite, and the like), mica, metal alkoxide particles from rare earth and transition metals, carbon based materials and molecules, such as graphene, graphite, and carbon nanotubes, metal organic frameworks.

In an embodiment, the disclosed composition may further comprise additives that that improve the manufacturing of the composition, such as surfactants, dispersants, and the like. The composition may also include additives that modify and improve the rheological properties of a chemical formulation. Examples of surfactants may include ionic and non-ionic industrial surfactants such as Triton-X, Capstone, and the like, and molecules such as fatty acid alcohols, esters, acids, or amides that show surface active properties. Examples of dispersants and rheological modifiers may include electrostatically stabilizing molecules such as long chain polyacrylic acid, sterically stabilizing highly branched polymer molecules, bulk viscosity increasing nanoparticles, or sub-micron sized particles of metal oxides. Other materials that exhibit viscoelastic properties may be used as a non-Newtonian fluid coating.

In some embodiments, the non-Newtonian fluid may also be suspended in an appropriate carrier solvent. Non-limiting examples of appropriate carrier solvents may be low molecular weight mineral oils, paraffins or iso-paraffins, alkanes or iso-alkanes, low molecular weight linear silicones or cyclic silicones, alkyl acetates, ketones, fully or partially halogenated hydrocarbons (including, but not limited to, alkanes, alkenes, alkynes, aromatic compounds, and the like), or aldehydes.

A non-Newtonian fluid can be designed to resist different types of liquid contaminants. A non-Newtonian fluid may exhibit hydrophobic, hydrophilic, oleophobic, or oleophilic characteristics, or any combination thereof. In one embodiment, the non-Newtonian fluid contains a hydrophobic material such as a functionalized poly siloxane.

A functionalized poly siloxane coating can increase the hydrophobicity of the device while also reducing the surface tension. A functionalized poly siloxane also exhibits oleophilic characteristics. Oleophilic compounds are desirable in a coating to absorb oils, such as oils secreted from the human body. In the present example, a functionalized poly siloxane can act as an oleophilic compound to absorb oils secreted by the human body. One example in which absorbing oils may be useful is to reduce or eliminate fingerprinting on an electronic device. The oleophilic compound of the non-Newtonian fluid can assimilate sebum into the coating by absorbing the sebum, which may reduce or eliminate finger printing on the electronic device.

In another embodiment, the non-Newtonian fluid contains a hydrophilic, or hygroscopic, material such as polysaccharide gums or carbomers. A hygroscopic material can absorb moisture from the air. In the current example, a hygroscopic material may be present in the non-Newtonian fluid, which may allow the compound to absorb ambient moisture and expand in volume, thereby insulating the coated device from water contact. The use of a hygroscopic material in a non-Newtonian fluid can be used to reduce fogging on the coating of the electronic device. The hygroscopic material may absorb the moisture in the air and spread it throughout the coated surface thereby reducing the amount of fog droplets forming on the coating.

In some embodiments, the non-Newtonian fluid may have aesthetic alterations made. The refractive index of the coating can be engineered using techniques known in the art. In one embodiment the non-Newtonian fluid coating can be engineered to match the refractive index of transparent materials. Matching the refractive index of transparent materials may maintain the clarity and transparency of the final product. In other embodiments, the refractive index of the non-Newtonian fluid coating may be engineered to match the refractive index of other desired materials.

In one embodiment, there is described a method of protecting an electronic device from liquid contamination. In this embodiment, protection of an electronic device can be achieved by treating the electronic device with a non-Newtonian fluid, as disclosed above.

A number of different methods can be used to form the described coating. Non-limiting examples of methods that can be used to form the disclosed coatings include physical processes, such as printing, spraying, dipping, rolling, brushing, jetting, or needle dispensing. Other techniques may also be used to form a moisture-resistant coating.

As previously disclosed, the properties of a non-Newtonian fluid allow for the treating of an electronic device without the need to mask components prior to treating. Thus, the disclosed method encompasses treating an electronic device with masked or unmasked components. Components may be introduced subsequent to the coating without the electric current between the electronic device and the component being impeded.

In one embodiment, a portion or the entirety of an internal component of an electronic device may be coated with a non-Newtonian fluid in a single application. In another embodiment, the non-Newtonian fluid may be applied as a coating to only certain parts of the electronic device. Still, in another embodiment, a non-Newtonian coating may be applied to the electronic device in multiple applications.

Traditional conformal coatings and vacuum coatings have limited methods of application. Due to the need for masking many components on electronic devices, certain methods of coating are not available. A larger variety of application methods may be used to apply non-Newtonian fluids as coatings. Certain application methods may allow for a thinner non-Newtonian fluid coating to be applied to the electronic device. Non-limiting examples of how non-Newtonian fluids can be applied to an electronic device include atomized or non-atomized spraying, dip coating, film coating, jetting, or needle dispensing. Non-Newtonian fluids can also be applied using traditional methods, for example through vapor depositing. Non-limiting examples of these vapor deposition techniques include chemical vapor deposition (CVD), plasma-based coating processes, atomic layer deposition (ALD), physical vapor deposition (PVD), vacuum deposition processes, sputtering, etc.).

In one embodiment, the use of any of the disclosed methods of application of a non-Newtonian fluid to an electronic device will result in a non-Newtonian fluid coating on the electronic device with a thickness in the range of 80 nm to 100 µm. The coating thickness may not inhibit the functionality or the thermal properties of the electronic device. Furthermore, the viscous properties of the viscoelastic fluid used in the non-Newtonian fluid may allow for the coating to be displaced when a component is introduced.

As indicated above, non-limiting example of an electronic device a non-Newtonian fluid may be applied to is a printed circuit board. The use of traditional conformal coating and vacuum coating for printed circuit boards is expensive due to the need to mask many components and the limited number of application methods that can be used. For instance, dip coating is difficult to use as a conformal coating application because the coating penetrates everywhere and masking must therefore be perfect. In this example, the printed circuit board can be coated with a non-Newtonian fluid composition coating using the dip coating method, as there is no need for masking. Any connectors, such as connecting male connectors to base female connectors on the printed circuit board, can be connected after coating without the electric current being affected. The non-Newtonian fluid coating is displaced to allow the connection to be made.

In another embodiment, there is described a coating to protect a substrate, the coating comprising at least one hydrophobic material comprising a polysiloxane compound and having electrical insulating properties. In an embodiment, the coating is hydrophobic, oleophobic, oleophilic, and exhibits viscoelastic properties that allow it to redistribute after being applied to the electronic component.

In the coating described herein the at least one hydrophobic material further comprising one or more functionalized polysiloxanes, linear and cyclic silicones, metal oxides, fumed functionalized silica, styrene-ethylene/butylene-styrene or styrene-ethylene/propylene-styrene materials swelled with mineral oils or diesters, long chain fatty alcohols, functionalized fluoropolymers, functionalized or non-functionalized poly oligomeric silsesquioxanes, hydrophilic gellants selected from carbomers, polysaccharide gums, and polyolefins.

The coating described herein may further comprise one or more solid particles selected from fluoropolymer particles, clay particles, mica, metal alkoxide particles, rare earth and transition metals, carbon-based materials selected from graphene, graphite, and carbon nanotubes, and metal organic frameworks.

The coating described herein may further comprise one or more additives selected from a surfactant, a dispersant, or a rheologic modifier.

In the coating described herein the composition can be suspended in a carrier solvent comprised of at least one compound chosen from low molecular weight mineral oils, paraffins or iso-paraffins, alkanes or iso-alkanes, low molecular weight linear silicones or cyclic silicones, alkyl acetates, ketones, fully or partially halogenated hydrocarbons, or aldehydes.

The coating described herein may have a thickness ranging from 25 nm to 200 µm when applied to an electronic device.

In an embodiment, the coating further comprises at least one hygroscopic material comprising a polysaccharide gum, a carbomer, or combinations thereof.

In one embodiment, there is disclosed an electronic device comprising the disclosed compound which is coated using the disclosed method to provide an electronic device having a protective coating comprising at least one hydrophobic or oleophilic compound. Once applied to the electronic device, the non-Newtonian fluid coating increases the resistance of the electronic device to liquid contaminates. In another embodiment, the non-Newtonian fluid coatings applied to the electronic device makes the device completely waterproof.

Still, in another embodiment, the non-Newtonian fluid coating applied to the electronic device contains an oleophilic compound designed to absorb oil, such as oils secreted from the human body. The absorption may result in a reduction or complete prevention of fingerprinting on the electronic device. In another embodiment the non-Newtonian fluid applied contains a hygroscopic material such as polysaccharide gums or carbomers, which can absorb ambient moisture and expand in volume thereby insulating from water contact. The embodiment may reduce fogging of the non-Newtonian fluid coating. Still, in another embodiment, the non-Newtonian fluid applied to the electronic device contains hydrophobic, hydrophilic, oleophobic, and oleophilic compounds.

Exemplary Deposition Methods

In one embodiment, the disclosed composition may be dispensed using a syringe and needle. For example, a syringe can be fitted with a needle, with a gauge having a gauge size ranging from 10 to 32, such as a needle having a gauge size of 16, 18 or 20, which will vary depending on the application required.

In another embodiment, the disclosed composition may be dispensed using a manual spraying device. For example, a hand-held spray gun can be used to atomize a coating, such as by using compressed air or nitrogen.

In another embodiment, the disclosed composition may be dispensed using an automated dispensing mechanism that may be used to apply a coating to an electronic device. For example, various nozzles that may be used to dispense a coating as described herein, such as a Nordson Asymtek™ wide beam spray valve. In other embodiments, the nozzle may comprise a spray valve comprises a PVA film coat valve, or a valve used in a PVA delta 6 automated coating dispensing machine.

Measurement Techniques

Following the application of a coating to an electronic device, the various properties may be measured in the following manners.

The hydrophobicity or hydrophilicity of a coating may be measured by observing the contact angle a water droplet makes on the surface of the coating. The oleophobicity or oleophilicity of a coating may be measured by observing the contact angle a droplet of hexadecane makes on the surface of the coating.

The electrical insulation of a coating may also be determined by measuring the dielectric withstanding voltage on a coated circuit board. A continuously increasing voltage may be applied on the coated circuit board, and the voltage at which the current arcs through to air may be determined. This voltage is a measure of the effectiveness of the coating.

The electrical insulation of a coating may also be determined by measuring a material electrical property of the coating, such as the loss tangent or the dielectric constant using a network analyzer.

The non-Newtonian nature of the coating may be measured by looking at various properties. The response of the coating to an applied stress or strain may be measured using a rheometer to study the deformation of the coating. The viscoelastic moduli may be measured using a Small Angle Oscillatory Stress sweep, and the yield stress and high sheer viscosity may be measured using a stress sweep.

The features and advantages of the present invention are more fully shown by the following examples which are provided for purposes of illustration, and are not to be construed as limiting the invention in any way.

EXAMPLES

The following examples disclose methods of preparing non-Newtonian compositions for application as a coating to an electronic device. Following the preparation, the composition may be applied to an electronic device using known techniques to form a protective coating.

Example 1

The following example provides a method for preparing a hydrophobic liquid that has electrical insulation capabilities by mixing a hydrophobic liquid in a solvent using one of many known agitation techniques. The non-polar nature of the resultant coating drives the hydrophobic nature of the coating.

A mixture containing 20% by weight phenylated siloxane and 80% by weight toluene was mixed at 25° C. using a Cowles blade mixer at 2000 rpm for 30 minutes, or until both components were completely mixed.

Example 2

The following example provides a method for preparing a mixture of hydrophobic liquids that have electrical insulation capabilities by mixing two or more hydrophobic liquids in a solvent using one of many known agitation techniques.

A mixture containing 10% by weight phenylated siloxane, 20% by weight fluoroalkane, and 70% by weight of a hydro-fluorocarbon (sold under the name DuPont™ Vertrel® XF, which is HFC 43-10mee or 2,3-dihydrodecafluoropentane; empirical formula $C_5H_2F_{10}$) were mixed together at 25° C. using an impeller mixer at 2000 rpm for 30 minutes, or until all three components formed a homogenous mixture.

Example 3

The following example provides a method for preparing a mixture of hydrophobic liquids with solid particles that both have electrical insulation capabilities by mixing a two or more hydrophobic liquids with two or more hydrophobic particles using one of many known agitation techniques.

A mixture containing 10% by weight phenylated siloxane, 20% by weight fluoroalkane, 5% by weight precipitated hydrophobically treated silica, and 65% by weight of a hydro-fluorocarbon (sold under the name DuPont™ Vertrel® XF) were mixed together using a rotor-stator homogenizer.

The phenylated siloxane, the fluoroalkane, and the hydro-fluorocarbon solvent were first mixed together at 25° C. using a roto-stator mixer at 10,000 rpm for 5 minutes until a homogenous solution was obtained.

The solid hydrophobically treated precipitated silica was then introduced in increment. The rotor-stator was run at 10,000 rpm every time the silica was introduced. The process was repeated until a homogenous dispersion was obtained.

Other embodiments of the invention will be apparent to those skilled in the art from consideration of the specification and practice of the invention disclosed herein. It is intended that the specification and examples be considered as exemplary only, with the true scope of the invention being indicated by the following claims.

What is claimed is:

1. A method of coating an assembled printed circuit board with a conformal coating, the method comprising:
   applying the conformal coating to the assembled printed circuit board,
   wherein the conformal coating is hydrophobic and electrically insulating, exhibits viscoelastic or non-Newtonian properties and comprises a composition of:
   at least one hydrophobic fluid; and
   one or more functionalized polysiloxanes, linear and cyclic silicones, styrene-ethylene/butylene-styrene or styrene-ethylene/propylene-styrene materials swelled with mineral oils or diesters, long chain fatty alcohols, functionalized or non-functionalized poly oligomeric silsesquioxanes, and polyolefins.

2. The method of claim 1, wherein the conformal coating is applied to a part of or the entirety of at least one side of the assembled printed circuit board without masking a component on the assembled printed circuit board.

3. The method of claim 2, wherein the conformal coating covers at least one male connector, female connector or both connectors on the assembled printed circuit board without adversely affecting the electrical properties of the assembled printed circuit board.

4. The method of claim 1, wherein the composition further comprises one or more metal oxides, fumed functionalized silica, fluoropolymer particles, clay particles, mica, metal alkoxide particles, rare earth and transition metals, carbon-based materials selected from graphene, graphite, and carbon nanotubes, and metal organic frameworks.

5. The method of claim 1, wherein the composition further comprises one or more surfactant, dispersant, hygroscopic material or rheologic modifier.

6. The method of claim 1, wherein the composition is suspended in a carrier solvent, the carrier solvent comprising at least one or more low molecular weight mineral oils, paraffins or iso-paraffins, alkanes or iso-alkanes, low molecular weight linear silicones or cyclic silicones, alkyl acetates, ketones, fully or partially halogenated hydrocarbons, or aldehydes.

7. The method of claim 1, wherein the conformal coating has a thickness ranging from 25 nm to 200 μm.

8. The method of claim 1, wherein applying the conformal coating is performed by at least one method chosen from atomized or non-atomized spraying, dip coating, film coating, jetting, and needle dispensing.

9. The method of claim 8, wherein the conformal coating is applied with a needle.

10. The method of claim 9, wherein the needle has a gauge size ranging from 10 to 32.

11. The method of claim 9, wherein the needle has a gauge size ranging from 16 to 20.

12. The method of claim 8, wherein the conformal coating is applied by using compressed air or nitrogen to atomize the coating.

13. The method of claim 1, wherein the conformal coating is able to redistribute after being applied to the printed circuit board.

14. The method of claim 1, wherein the conformal coating protects the circuit board from at least one liquid or particulate contaminant.

15. The method of claim 14, wherein the liquid contaminant comprises water, bodily fluids, or combinations thereof.

16. The method of claim 1, wherein the conformal coating is applied to a part of or the entirety of at least one side of the assembled printed circuit board.

17. A method of protecting an assembled printed circuit from liquid and/or particulate contaminants, the method comprising:
   applying to the assembled printed circuit board a conformal coating comprising a composition of:
   at least one hydrophobic fluid; and
   one or more functionalized polysiloxanes, linear and cyclic silicones, styrene-ethylene/butylene-styrene or styrene-ethylene/propylene-styrene materials swelled with mineral oils or diesters, long chain fatty alcohols, functionalized or non-functionalized poly oligomeric silsesquioxanes, and polyolefins,
wherein the conformal coating is hydrophobic, electrically insulating, and exhibits viscoelastic or non-Newtonian properties.

18. The method of claim 17, wherein the conformal coating has a thickness ranging from 25 nm to 200 μm, and is applied by at least one method chosen from atomized or non-atomized spraying, dip coating, film coating, jetting, and needle dispensing.

19. The method of claim 17, wherein the composition further comprises:
- one or more particles selected from metal oxides, fumed functionalized silica, fluoropolymer particles, clay particles, mica, metal alkoxide particles, rare earth and transition metals, carbon-based materials selected from graphene, graphite, and carbon nanotubes, and metal organic frameworks; or
- one or more surfactant, dispersant, hygroscopic material or rheologic modifier,
- wherein said composition is suspended in a carrier solvent carrier, the carrier solvent carrier comprising at least one or more low molecular weight mineral oils, paraffins or iso-paraffins, alkanes or iso-alkanes, low molecular weight linear silicones or cyclic silicones, alkyl acetates, ketones, fully or partially halogenated hydrocarbons, or aldehydes.

* * * * *